United States Patent
Cook et al.

(10) Patent No.: US 9,754,759 B2
(45) Date of Patent: Sep. 5, 2017

(54) ELECTROSTATIC MULTIPOLE DEVICE, ELECTROSTATIC MULTIPOLE ARRANGEMENT, AND METHOD OF MANUFACTURING AN ELECTROSTATIC MULTIPOLE DEVICE

(71) Applicant: ICT Integrated Circuit Testing Gesellschaft für Halbleiterprüftechnik mbH, Heimstetten (DE)

(72) Inventors: Benjamin John Cook, München (DE); Dieter Winkler, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 14/947,241

(22) Filed: Nov. 20, 2015

(65) Prior Publication Data
US 2017/0148609 A1  May 25, 2017

(51) Int. Cl.
*H01J 37/12* (2006.01)
*H01J 37/147* (2006.01)

(52) U.S. Cl.
CPC ............ *H01J 37/12* (2013.01); *H01J 37/147* (2013.01)

(58) Field of Classification Search
CPC ................................ H01J 37/12; H01J 37/147
USPC ...................................................... 250/396 R
See application file for complete search history.

(56) References Cited

U.S. PATENT DOCUMENTS

| | | | |
|---|---|---|---|
| 6,563,124 B2 * | 5/2003 | Veneklasen | B82Y 10/00 250/398 |
| 7,875,858 B2 | 1/2011 | Ito et al. | |
| 8,933,425 B1 * | 1/2015 | Bevis | H01J 37/3174 250/396 R |
| 2008/0230711 A1 * | 9/2008 | Platzgummer | B82Y 10/00 250/396 R |
| 2012/0273690 A1 * | 11/2012 | Wieland | G03F 7/2059 250/396 R |
| 2015/0371811 A1 * | 12/2015 | Ogawa | H01J 37/12 250/305 |

OTHER PUBLICATIONS

U.S. Appl. No. 14/947,568, Notice of Allowance mailed on Dec. 8, 2016, 8 pages.
U.S. Appl. No. 14/947,609, Notice of Allowance mailed on Dec. 5, 2016, 8 pages.

\* cited by examiner

*Primary Examiner* — Michael Maskell
(74) *Attorney, Agent, or Firm* — Kilpatrick Townsend & Stockton LLP

(57) ABSTRACT

An electrostatic multipole device for influencing a charged particle beam propagating along an optical axis is described. The electrostatic multipole device comprises a substrate with at least one aperture opening for the charged particle beam, which extends along the optical axis through the substrate, and four or more electrodes which are formed on a first main surface of the substrate to influence the charged particle beam propagating through the aperture opening, wherein each of the four or more electrodes is arranged at a radial distance from a beam limiting edge of the aperture opening. Further, a method of manufacturing an electrostatic multipole device is described.

19 Claims, 7 Drawing Sheets

ELECTROSTATIC MULTIPOLE DEVICE, ELECTROSTATIC MULTIPOLE ARRANGEMENT, AND METHOD OF MANUFACTURING AN ELECTROSTATIC MULTIPOLE DEVICE

TECHNICAL FIELD

Embodiments described herein relate to electrostatic multipole devices for influencing a charged particle beam, e.g. an electron beam, for example, for inspection system applications, testing system applications, defect review or critical dimensioning applications, surface imaging applications (SEM) or the like, as well as to methods of manufacturing an electrostatic multipole device. Embodiments also relate to an electrostatic multipole arrangement including two or more electrostatic multipole devices. An electrostatic multipole device and an electrostatic multipole arrangement according to embodiments disclosed herein may be used in a charged particle beam device configured as a multi-beam system. Further embodiments relate to methods of manufacturing an electrostatic multipole device.

BACKGROUND

Modern semiconductor technology has created a high demand for structuring and probing specimens in the nanometer or even in the sub-nanometer scale. Micrometer and nanometer scale process control, inspection or structuring, is often done with charged particle beams, e.g. electron beams, which are generated, shaped, deflected and focused in charged particle beam devices, such as electron microscopes or electron beam pattern generators. For inspection purposes, charged particle beams offer superior spatial resolution compared to, e.g., photon beams, because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems, fine probes with high current density can be used. For instance, in the case of an SEM, the primary electron (PE) beam generates particles like secondary electrons (SE) and/or backscattered electrons (BSE) that can be used to image and analyze a specimen.

One drawback of electron-beam based systems is the limited probe current within the focused spot. With increasing resolution (decreasing spot size), probe current is further decreased because of a reduced aperture angle required to control the aberrations. Higher brightness sources can provide only limited improvements for the probe current, because of the electron-electron interactions. Many approaches have been made to reduce e-e interactions in electron beam systems, which are, for example, reduced column length and/or higher column energy combined with late deceleration of the electron beam to the final landing energy just in front of the sample. However, improvement of single electron beam throughput at required resolution is increasingly challenging. One approach to solve such problems is the use of multiple beams, which may be generated by a single source, within one column, which reduce the throughput by the number of beams.

Individually directing, deflecting, shaping, correcting, and focusing the individual beamlets of such a multiple-beam system is, however, challenging. Electrostatic multipole deflectors and correctors such as electrostatic octupole devices may be used for this purpose. However, it is difficult to sufficiently miniaturize electrostatic multipole devices and at the same time maintain excellent beam influencing properties and electrical field properties. Whereas miniaturized electrostatic dipole devices, e.g. blanking devices, may be manufactured with manageable effort, it is particularly difficult to provide miniaturized multipole devices such as quadrupole or octupole devices which are suitable for generating excellent electric field qualities.

Further, also multipole devices for single charged particle beam systems may suffer from an insufficient quality of the electrostatic fields which may lead to an increased spot size and impair the achievable spatial resolution of charged particle beam devices. Accordingly, there is a need for electrostatic multipole devices which may provide excellent field qualities to be used for deflecting and/or correcting charged particle beams.

SUMMARY

In light of the above, according to the independent claims, an electrostatic multipole device for influencing a charged particle beam propagating along an optical axis and an electrostatic multipole arrangement with two or more electrostatic multipole devices are provided. According to a further aspect, methods of manufacturing an electrostatic multipole device for influencing a charged particle beam are provided. Further aspects, advantages, and features of the embodiments are apparent from the dependent claims, the description, and the accompanying drawings.

According to embodiments described herein, an electrostatic multipole device for influencing a charged particle beam propagating along an optical axis is provided, including: a substrate with at least one aperture opening for the charged particle beam, which extends along the optical axis through the substrate; and four or more electrodes which are formed on a first main surface of the substrate for influencing the charged particle beam propagating through the aperture opening, wherein each of the four or more electrodes is arranged at a radial distance from a beam limiting edge of the aperture opening.

According to a further aspect described herein, an electrostatic multipole arrangement for individually influencing at least a first beamlet of charged particles propagating along a first optical axis and a second beamlet of charged particles propagating along a second optical axis is provided, including: a substrate with a first aperture opening for generating the first beamlet which extends through the substrate along the first optical axis and a second aperture opening for generating the second beamlet which extends through the substrate along the second optical axis; four or more first beamlet electrodes which are formed on a first main surface of the substrate for influencing the first beamlet, wherein each of the four or more first beamlet electrodes is arranged at a radial distance from a beam limiting edge of the first aperture opening; and four or more second beamlet electrodes which are formed on the first main surface of the substrate for influencing the second beamlet, wherein each of the four or more second beamlet electrodes is arranged at a radial distance from a beam limiting edge of the second aperture opening.

According to a further aspect described herein, a method of manufacturing an electrostatic multipole device for influencing a charged particle beam propagating along an optical axis is provided, including: providing a multilayer substrate with an insulator layer and a conductor or semiconductor layer arranged on top of the insulator layer; forming at least one aperture opening for the charged particle beam which extends along the optical axis through the multilayer substrate; and partially removing the conductor or semiconductor layer such that remaining portions of the conductor or semiconductor layer form four or more electrodes on a first main surface of the insulator layer for influencing the charged particle beam propagating through the aperture opening, wherein each of the four or more electrodes is arranged at a radial distance from a beam limiting edge of the aperture opening.

Embodiments are also directed at apparatuses for carrying out the disclosed methods and include apparatus parts for performing the individual method actions. This method may be performed by way of hardware components, a computer programmed by appropriate software, by any combination of the two or in any other manner. Furthermore, embodiments according to the invention are also directed at methods of operating the described apparatus.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to one or more embodiments and are described in the following.

DETAILED DESCRIPTION

Figure 1:
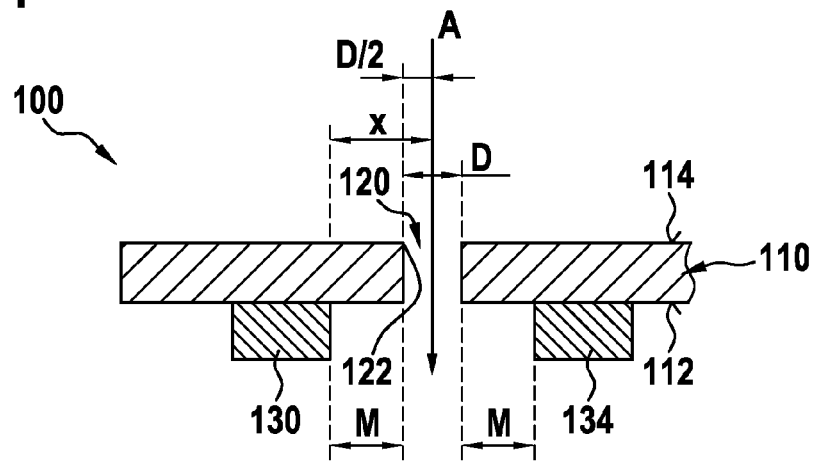
FIG. 1 shows an electrostatic multipole device according to embodiments described herein in a schematic sectional view.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Electrostatic multipole devices such as electrostatic quadrupole devices or electrostatic octupole devices may be used for correcting aberrations of beams of charged particles. For example, in an exemplary geometry, eight electrodes may be arranged, e.g. on the circumference of a circle, around the propagation path of the charged particle beam. For example, the electrodes may be equally spaced by 45° from each other. Depending on the desired influence on the charged particle beam, potentials of +V and −V may be alternately applied to the electrodes in order to provide for an octupole field for correcting an astigmatism of the charged particle beam. Alternatively, voltages of, e.g., +V, +√2/2V, 0, −√2/2V, −V, −√2/2V, 0, +√2/2V may be applied to the electrodes in this order in the circumferential direction in order to provide for a dipole field suitable for deflecting the charged particle beam. In another example, four electrodes may be arranged, e.g. on the circumference of a circle, around the propagation path of the charged particle beam. For example, the electrodes may be equally spaced at 90° from each other in order to provide for an electrostatic quadrupole device. Potentials of +V and −V may be alternately applied to the electrodes in order to provide for a quadrupole field.

Electrostatic multipole devices may be built by applying electrodes made of a conductive material to a support structure made e.g. of an insulating material. For example, compact dipole devices may be manufactured by arranging two plate electrodes or curved electrodes on opposing sides of the charged particle beam in such a way that a sufficiently large clearance for the charged particle beam is provided between the deflector electrodes. Hence, a good quality electric deflection field can be applied to the charged particle beam for deflecting the charged particle beam by a predetermined deflection angle with respect to the optical axis.

In some cases, providing a dipole device may not be sufficient. For example, a quadrupole device or an octupole device may be needed to correct beam aberrations such as spherical aberrations or astigmatism. However, manufacture of a quadrupole device or another higher order multipole device with small lateral dimensions may be difficult, because the electrodes are to be arranged at various angular positions with respect to the charged particle beam. e.g. on a circular line extending around the optical axis. Charged particles of the charged particle beam may propagate close to one of the electrodes and propagate through edge regions of the electric correction field, where the quality of the electric field may be inferior as compared to the quality of the electric field near the optical axis.

In order to make sure that the charged particles will only enter a central region between the electrodes, an aperture plate with a small aperture opening may be placed upstream from the electrostatic multipole device, in order to center the charged particle beam with respect to the electrodes arranged downstream from the aperture plate. However, relative alignment of the aperture plate and the multipole device may be difficult in the case of miniaturized devices due to the small spatial dimensions. In order to solve the above mentioned problems, according to embodiments described herein, an electrostatic multipole device is provided which is both easy to manufacture in a miniaturized form, and which is at the same time configured to provide a high quality electric field in a center region between the electrodes. Further, the position of the charged particles in the system, particularly relative to the electrodes, may be controlled.

An electrostatic multipole device 100 according to embodiments described herein is shown in FIG. 1 in a schematic sectional view. The electrostatic multipole device 100 is configured to influence a charged particle beam, e.g. an electron beam, propagating along the optical axis through an aperture opening 120. The electrostatic multipole device 100 includes a substrate 110 with the at least one aperture opening 120 for the charged particle beam, which extends along the optical axis A through the substrate, and four or more electrodes 130, 132, 134, 136 which are formed on a first main surface 112 of the substrate to influence the charged particle beam propagating through the aperture opening 120. Two (130, 134) of the four or more electrodes which may be arranged on opposite sides of the aperture opening 120 are shown in the sectional view of FIG. 1.

The four or more electrodes are arranged at a radial distance (M) from a beam limiting edge 122 of the aperture opening, respectively. In other words, not the electrodes themselves form a beam limiting edge for the charged article beam, but the electrodes are arranged radially outside with respect to the beam limiting edge of the aperture opening. Therefore, charged particles of the charged particle beam propagating through the aperture opening parallel with respect to the optical axis pass at a distance from the electrodes. As a result, the charged particles do not propagate through edge regions of the electric field where the electric field may deviate from the electric field on the optical axis. The beam limiting edge 122 of the aperture opening may be a portion of smallest clear width or of smallest clear diameter of the aperture opening, which limits the radial extension of the charged particle beam propagating through the aperture opening.

For example, the aperture opening 120 may extend through the substrate 110 with an essentially constant width or diameter D, as is illustrated in FIG. 1. In this case, the beam limiting edge 122 of the aperture opening corresponds to an entrance edge of the aperture opening 120, as the width of a collimated charged particle beam propagating parallel to the optical axis is limited upon entrance into the aperture opening 120. The radial distance M between the beam limiting edge 122 and the electrode 130 corresponds to the length of the radial component of a connecting line connecting the beam limiting edge and the electrode. The "radial direction" as used herein may refer to a direction extending radially outward from the optical axis in a perpendicular direction with respect to the optical axis.

Figure 3A:
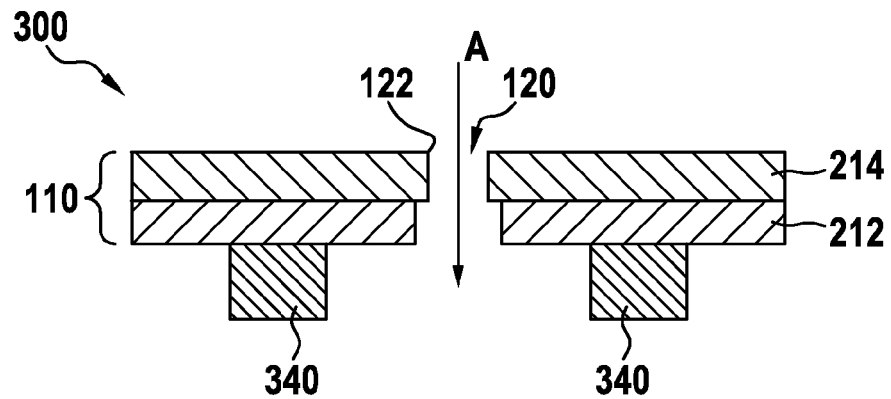
FIG. 3A shows an electrostatic multipole device according to embodiments described herein in a schematic sectional view.
Figure 5:
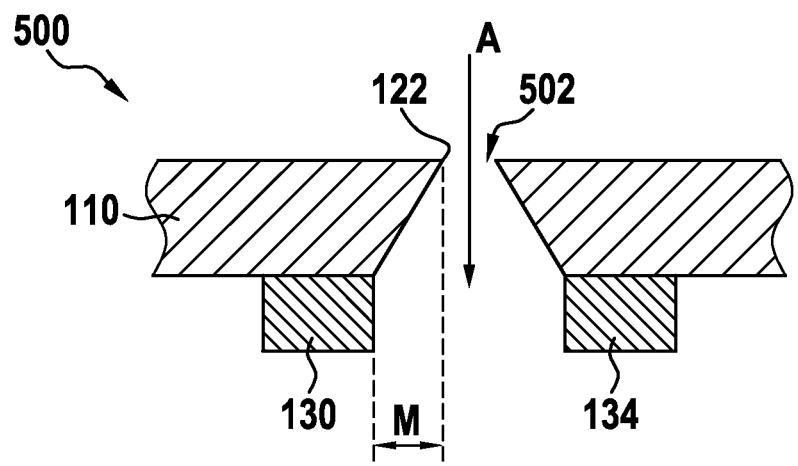
FIG. 5 shows an electrostatic multipole device according to embodiments described herein in a schematic sectional view.
Figure 6:
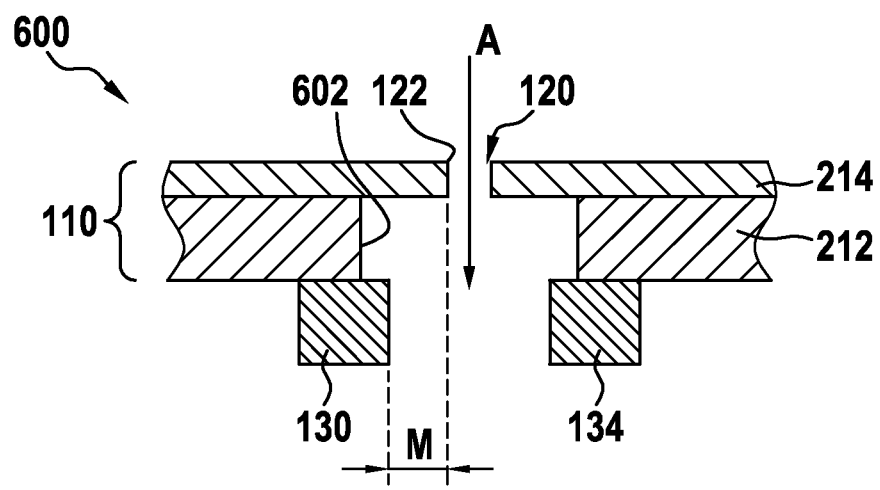
FIG. 6 shows an electrostatic multipole device according to embodiments described herein in a schematic sectional view.

In some implementations, the width of the aperture opening 120 may at least partially vary, e.g. increase, from an upstream side of the aperture opening to a downstream side of the aperture opening in a stepwise or continuous way. Some examples are illustrated in FIGS. 3A, 5, and 6. Also in this case, the beam limiting edge 122 of the aperture opening may correspond to an entrance edge of the aperture opening, as the width of the charged particle beam is limited upon entrance into the aperture opening 120. The radial distance M between the beam limiting edge 122 and the electrode 130 corresponds to the length of the radial component of a connecting line connecting the beam limiting edge and the electrode. Therefore, charged particles propagating through the aperture opening parallel to the optical axis pass at a distance from each of the electrodes.

In order to make sure that the charged particles only propagate through a central region between the electrodes, where the electric field may have a better quality as compared to a radially outer edge region, the distance M may be 10 µm or larger, particularly 50 µm or larger, more particularly 100 µm or larger, or even 500 µm or larger. In some implementations, for each of the electrodes, a ratio (M/X) between the distance M and a distance X, which is the radial distance between the electrode and the optical axis, may be 0.5 or more, particularly 0.6 or more, more particularly 0.8 or more.

According to some embodiments, the substrate 110 is both configured for providing the aperture opening 120 for the charged particle beam and for holding the electrodes on a first main surface thereof downstream from the aperture opening. The charged particle beam is automatically centered between two opposing electrodes due to the fixed spatial relationship between the aperture opening and the electrodes. Therefore, there is no need to adjust a relative spatial arrangement between an aperture plate and the electrodes, as a single module comprising aperture opening and electrodes is provided. In some implementations, the electrodes are fixed to the first main surface of the substrate, e.g. in a bonded connection. In some implementations, the electrodes are manufactured integrally with the substrate.

The four or more electrodes 130, 132, 134, 136 may be arranged on the first main surface of the substrate 110 at respective angular positions with respect to the optical axis. If the electrostatic multipole device is provided as a quadrupole device, the electrodes may be arranged at angles of 0° (+/−5°), 90° (+/−5°), 180° (+/−5°), and 270° (+/−5°), with the optical axis being arranged at a center position. Two electrodes may be arranged on opposite sides of the aperture opening 120, respectively, as is shown in FIG. 1.

The substrate may be a flat plate substrate, e.g. a wafer such as a multilayer wafer. For example, the substrate may be a multilayer substrate with at least one insulator layer on which the electrodes are formed.

In some embodiments, which may be combined with other embodiments disclosed herein, the aperture opening may have a round or a circular cross-sectional shape. Thus, a round or circular beamlet of charged particles can be generated by directing a wide-angle charged particle beam along the optical axis through the aperture opening. The aperture opening may have a minimum diameter D (clear diameter) of 1 mm or less, particularly 500 µm or less, more particularly 200 µm or less, or even 100 µm or less.

In some implementations, a minimum radius (D/2) of the aperture opening may be smaller, particularly less than ½, more particularly less than ⅓, more particularly less than ⅕, of the radial distance X between the optical axis A and the four or more electrodes. In some implementations, the inner electrode surfaces of the four or more electrodes may be arranged on a circular line extending around the optical axis A, wherein the radius of the circular line may be larger than twice the minimum radius (D/2) of the aperture opening. In some implementations, the minimum diameter D of the aperture opening 120 may be smaller than the minimum distance between two of the four or more electrodes 130, 134 which are arranged on opposite sides of the aperture opening 120, respectively. In some implementations, the radial distance X from the optical axis is the same for each of the electrodes.

The manufacture of the electrostatic multipole device 100 according to embodiments disclosed herein can be simplified, when some or all of the electrodes comprise e.g. silicon or doped silicon. Silicon electrodes arranged on top of a flat substrate may be formed in a particularly easy way in a miniaturized form from an SOI substrate (Silicon-on-Insulator). Further, the conductivity of crystalline silicon or doped silicon may be sufficient to form electrodes of an electrostatic multipole device therefrom. Electrodes made from an even higher conductivity material, e.g. a metal, may not be needed. In other implementations, the electrodes can comprise or be made of a metal. Yet, further other material systems may be suitable to provide a multi-layer wafer structure with an insulator or semiconductor similar to an SOI wafer.

Figure 2A:
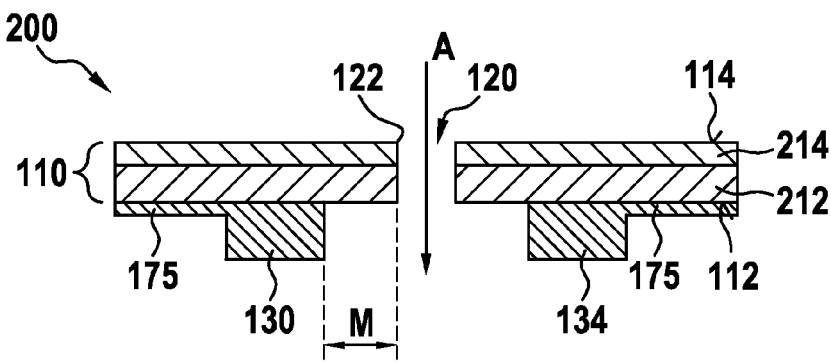
FIG. 2A shows an electrostatic multipole device according to embodiments described herein in a schematic sectional view.
Figure 2B:
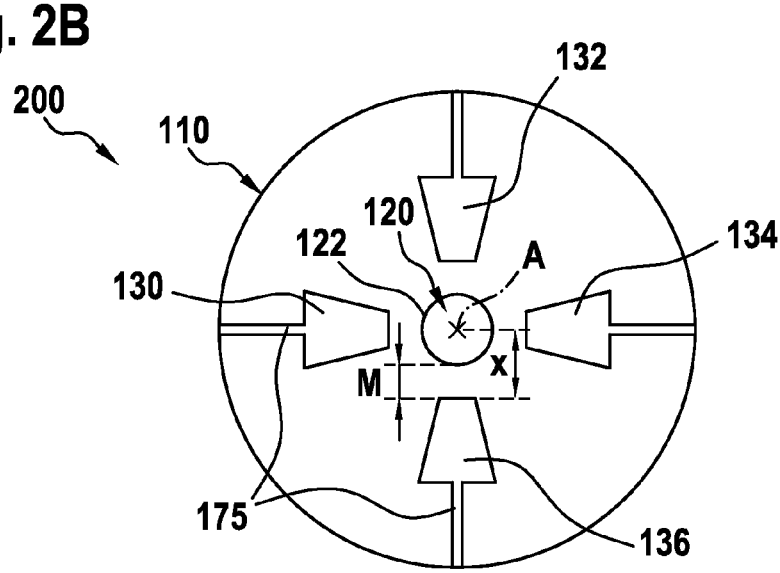
FIG. 2B shows the electrostatic multipole device of FIG. 2A in a front view.

FIG. 2A shows an electrostatic multipole device 200 according to embodiments described herein in a schematic sectional view. FIG. 2B shows the electrostatic multipole device 200 in a front view, wherein the downstream side of the electrostatic multipole device 200 is illustrated. The electrostatic multipole device 200 essentially corresponds to the electrostatic multipole device 100 shown in FIG. 1 so that reference can be made to the above explanations which are not repeated here. Only the differences with respect to the embodiment of FIG. 1 will be detailed below.

The electrostatic multipole device 200 includes a multi-layer substrate 110 comprising at least one insulator layer 212 on which the four or more electrodes 130, 132, 134, 136 are formed. The electrodes are formed from a material with a higher conductivity as compared to the material of the insulator layer 212. For example, the electrodes 130, 132, 134, 136 are formed from a conductor or a semiconductor material such as a metal or silicon which is arranged on a first main surface 112 of the insulator layer.

The electrodes may be configured to be connectable to a respective electric potential. For example, a voltage supply may be provided to connect each of the electrodes with a respective voltage. In some cases, each electrode may be connected with a respective connection line 175 for connecting the electrode with the voltage supply. The connection lines may be at least partially integrated in the insulator layer 212. In some embodiments, the connection lines 175 may be provided at least partially on the first main surface 112 of the substrate where also the electrodes are formed (as is indicated in FIG. 2A). For example, the connection lines 175 for connecting the electrodes with a respective electric potential are made from the same material as the electrodes and/or extend radially outward from the electrodes on top of the insulator layer, i.e. on the first main surface of the substrate.

As is illustrated in FIG. 2B, four electrodes 130, 132, 134, 136 are arranged on the first main surface 112 of a flat substrate 110 at respective angular positions with respect to the optical axis A to provide a quadrupole device. The quadrupole device may be used for at least one of deflecting the charged particle beam with respect to the optical axis A and correcting aberrations of the charged particle beam. Further, as is illustrated in FIG. 2B, each of the four electrodes 130, 132, 134, 136 is formed at the same distance X from the optical axis A, wherein the distance X is larger than the minimum radius of the aperture opening. In other words, each of the four or more electrodes is arranged at a radial distance M from a beam limiting edge 122 of the aperture opening 120. The distance X may be more than twice the minimum radius of the aperture opening, in order to make sure that the charged particle beam will propagate at a distance from the electrodes.

In the embodiment shown in FIG. 2A, the substrate 110 includes the insulator layer 212 on top of which the electrodes are formed, and the substrate includes a further layer 214 with a semiconductor or conductor material, wherein the further layer is arranged below the insulator layer 212. The further layer 214 may be arranged on the opposite side of the insulator layer 212 with respect to the first main surface 112 on which the electrodes are formed. The further layer 214 may comprise a second main surface 114 of the substrate which is directed to an upstream side of the electrostatic multipole device 200.

The further layer 214 may be made of a material with a higher conductivity than the isolator layer 212, e.g. a metal or a semiconductor, particularly silicon. In some implementations, both the electrodes and the further layer may be made of silicon, whereas the insulator layer may include $SiO_2$ or another insulator such as sapphire. Charged particles of the charged particle beam impinging on the second main surface 114 of the substrate 110 do not accumulate on the second main surface 114, when the second main surface 114 is a conductor or semiconductor surface.

The electrodes 130, 132, 134, 136 may be provided as conductive layer sections on top of the insulator layer 212. The electrodes may be formed on the insulator layer 212 by applying a mask on a multilayer substrate and removing portions of an initially uniform top layer so that remaining portions of the top layer form the electrodes.

The electrodes may comprise or consist of silicon. In order to manufacture the electrodes, an initially uniform silicon layer which may be the top layer of an SOI-wafer can be partially removed, e.g. etched, to so that the remaining portions of the silicon layer form the electrodes. The electrodes may be trapezoidally shaped in a front view, and be arranged at evenly spaced angular positions, as is illustrated in FIG. 2B. In some implementations, the electrodes may have shapes different from a trapezoidal shape. For example, an inner surface of the electrodes may be curved. Alternatively, the electrode may be provided as conductive lines which may extend essentially in a radial direction with respect to the optical axis. In some embodiments, which may be combined with other embodiments described herein, the electrodes may extend over an angular range of less than 30°, particularly less than 15°. For example, in the case of a 12-pole or 20-pole device, the individual electrodes may extend over an angular range of less than 10° or less than 5°.

Figure 3B:
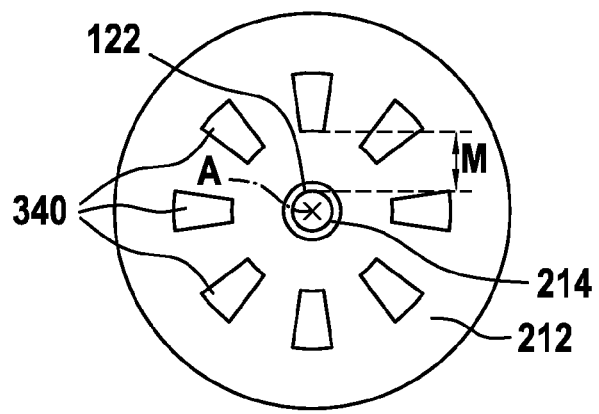
FIG. 3B shows the electrostatic multipole device of FIG. 3A in a front view.
Figure 3C:
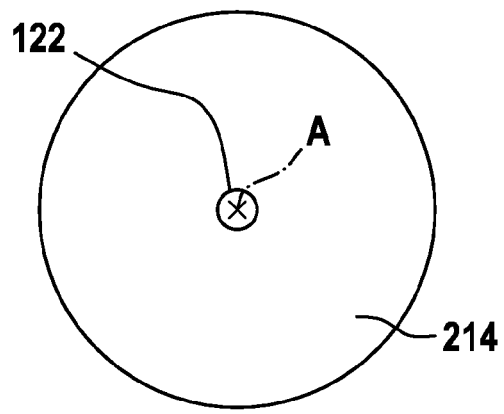
FIG. 3C shows the electrostatic multipole device of FIG. 3A in a rear view.

FIG. 3A shows an electrostatic multipole device 300 according to embodiments described herein in a schematic sectional view. FIG. 3B shows the electrostatic multipole device 300 in a front view, in which the downstream side of the electrostatic multipole device 300 is illustrated. FIG. 3C shows the electrostatic multipole device 300 in a rear view, in which the upstream side of the electrostatic multipole device 300 is illustrated. The electrostatic multipole device 300 essentially corresponds to the electrostatic multipole device shown in FIG. 2A so that reference can be made to the above explanations which are not repeated here. Only the differences with respect to the embodiment of FIG. 2A will be detailed below.

The electrostatic multipole device 300 is configured as an octupole device with a total of eight electrodes 340 which are arranged at evenly spaced angular positions in a circumferential direction around the aperture opening 120. The octupole device may be used for at least one of deflecting the charged particle beam by a predetermined deflection angle, and correcting aberrations of the charged particle beam, e.g. spherical aberrations, astigmatism or other higher order beam aberrations. Alternatively, the multipole device may be configured as a 12-pole or as a 20-pole device with a total of 12 or 20 electrodes, which can be used for correcting even higher order aberrations.

The electrodes 340 are formed on the first main surface 112 of the substrate 110 which is a multipole substrate including an isolator layer 212, on top of which the electrodes 340 are formed, and a further layer 214 which comprises the beam limiting edge 122 of the aperture opening 120.

In some embodiments, which may be combined with other embodiments described herein, the aperture opening 120 extends through the insulator layer 212 with a first diameter and through the further layer 214 with a second diameter which is smaller than the first diameter to form the beam limiting edge 122 of the aperture opening. Therefore, the charged particles of the charged particle beam propagating through the aperture opening 120 not only pass at a distance from the electrodes, but also pass at a distance from the insulator layer 212. As a result, less surface charges accumulate on an inner surface of the aperture opening, where the insulator layer may be exposed to the charged particle beam.

An electrostatic multipole device 300 as shown in FIGS. 3A-3C may be manufactured as follows. First, a multilayer substrate with an insulator layer 212 sandwiched between two further layers which may be conductor or semiconductor layers is provided. The multilayer substrate may be an SOI-wafer with an insulator layer 212 sandwiched between two silicon layers. At least one aperture opening for the charged particle beam is formed, e.g. by etching, which extends along the optical axis A through the multilayer substrate. One of the two conductor or semiconductor layers is partially removed such that remaining layer portions form the electrodes on the first main surface of the insulator layer. The electrodes are configured to influence the charged particle beam propagating through the aperture opening. Partially removing the conductor or semiconductor layer may include removing portions of the conductor or semiconductor layer such that each of the electrodes 340 is arranged at a radial distance from a beam limiting edge 122 of the aperture opening 120.

Optionally, the insulator layer may be at least partially removed from an inner portion of the aperture opening, e.g. by etching, so that a first diameter of the aperture opening formed in the insulator layer 212 is larger than a second diameter of the aperture opening formed in the further layer 214 which constitutes the upstream layer of the multipole device. Therefore, charged particles of the charged particle beam will primarily come into contact with the further layer 214 which comprises the beam limiting edge, so that accumulations of surface charges on an insulator surface can be avoided.

Therefore, the four or more electrodes may be formed by material removal from a silicon containing top layer of an SOI-wafer arranged on the insulator layer 212. Thus, the electrodes are integrally formed with the insulator layer so that a very compact and robust setup of the multipole device which is easy to manufacture can be provided. Alternatively or additionally, the further layer 214 which is arranged on an upstream side of the insulator layer may be a bottom layer of an SOI-wafer which is also integrally formed with the insulator layer 212.

According to the above described method of manufacturing the multipole device, an SOI-wafer is processed with a minimal number of processing actions, where material is removed, to create the basic structure of the electrostatic multipole device. For example, one or two masking and etching actions may be sufficient to manufacture a miniaturized electrostatic multipole device from a typical flat SOI-wafer. A first masking and etching action may be performed to etch the aperture opening through the SOI-wafer, and a second masking and etching action may be performed to form the electrodes from the top layer of the SOI-wafer, or vice versa. At this stage, one could stop in principle. However, stray electrons may still meet the insulator layer and charge up the insulator layer, causing beam distortions.

In order to solve this problem, one can etch back the insulator layer from an inside surface of the aperture opening. For example, as is shown in FIG. 3A, the insulator layer 212 may be partially removed from inside the aperture opening, where an exposed insulator surface may be present. As a result, the probability of electrons hitting an isolator surface can be further reduced.

Alternatively or additionally, in some embodiments, which may be combined with other embodiments disclosed herein, the electrostatic multipole device may be at least partially coated with a high-resistance layer on an outer surface thereof. The high-resistance layer may at least partially cover an exposed portion of an insulating surface, in order to prevent charging up of the insulating surface.

Figure 4A:
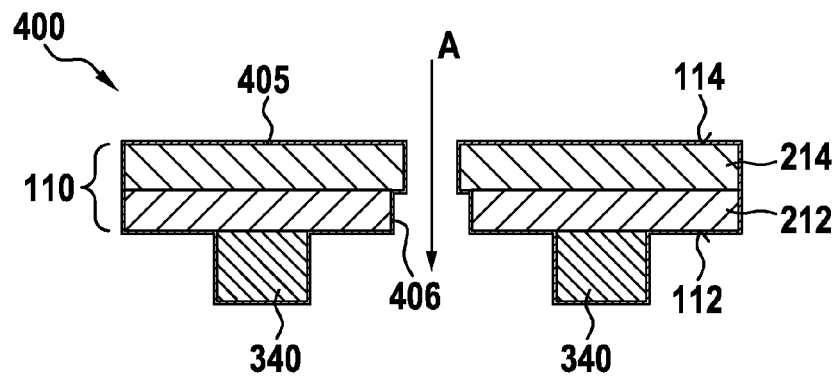
FIG. 4A shows an electrostatic multipole device according to embodiments described herein in a schematic sectional view.
Figure 4B:
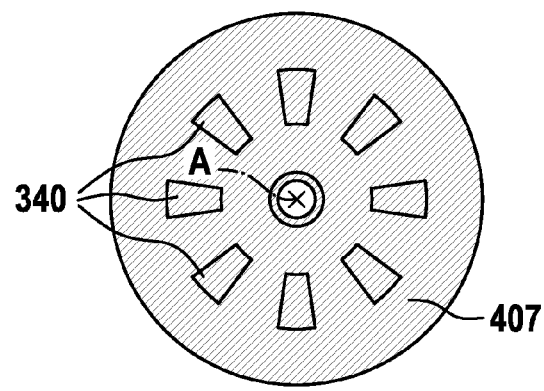
FIG. 4B shows the electrostatic multipole device of FIG. 4A in a front view.
Figure 4C:
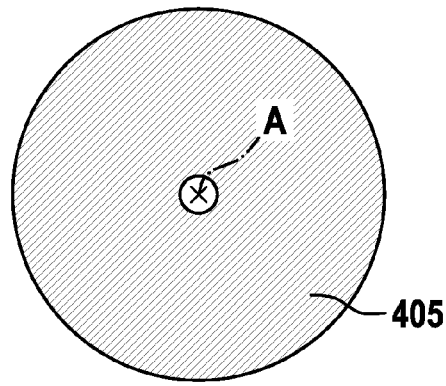
FIG. 4C shows the electrostatic multipole device of FIG. 4A in a rear view.

An example of an electrostatic multipole device 400 with a high-resistance layer provided as a coating on an outer surface of the substrate and/or on the electrodes is shown in FIG. 4A, FIG. 4B, and FIG. 4C. The electrostatic multipole device 400 essentially corresponds to the electrostatic multipole device shown in FIGS. 3A to 3C so that reference can be made to the above explanations which are not repeated here. The electrostatic multipole device 400 is provided with a high-resistance layer.

In some embodiments, a first portion 407 of the high-resistance layer extends at least partially around the optical axis A between two adjacent electrodes 340, respectively, and is configured to allow a current flow between the electrodes 340.

The high-resistance layer may be a coating which at least partially covers a first main surface 112 of the insulator layer 212 in a region between the electrodes 340. In some implementations, the first portion 407 of the high-resistance layer covers both the electrodes 340 which are formed on the insulator layer 212 and portions of the insulator layer 212 between the electrodes. For example, in the embodiment shown in FIGS. 4A to 4C, the entire downstream surface of the electrostatic multipole device 400 is covered with the first portion 407 of the high-resistance layer.

The high-resistance layer may be a carbon layer. Alternatively or additionally, the high-resistance layer may be configured such that two electrodes 340 which are adjacent to each other in a circumferential direction are not completely electrically isolated from each other. Rather, a small current of 1 nA or more, particularly 10 nA or more, and/or or 10 µA or less, particularly 1 µA or less, may flow between adjacent electrodes which are set on different electric potentials. Alternatively or additionally, the high-resistance layer 407 may have a thickness of 0.1 nm or more, particularly 10 nm or more and/or a thickness of 100 μm or less, particularly 10 μm or less. Alternatively or additionally, the high-resistance layer may be provided with a predetermined thickness and geometry and be made of a predetermined material such that an electric resistance of more than 1 MΩ and less than 100 GΩ, particularly more than 10 MΩ and less than 10 GΩ, between two electrodes which are adjacent to each other in the circumferential direction is obtained.

In some embodiments, which may be combined with other embodiments disclosed herein, a second portion 406 of the high-resistance layer may be provided on an inner surface of the aperture opening 120, particularly on an exposed portion of the insulator layer 212 in the aperture opening.

In some embodiments, which may be combined with other embodiments disclosed herein, a third portion 405 of the high-resistance layer may be provided on an exposed main surface of a further layer 214 arranged below the insulator layer 212, i.e. on an upstream side of the insulator layer.

By providing the high-resistance layer on top of the isolator layer 212, exposed insulator surfaces of the electrostatic corrector may be avoided, and an essentially continuous drop or rise of electric potential between adjacent corrector electrodes can be achieved. Thus, the spatial properties of the electric correction field can be further improved.

FIG. 5 shows an electrostatic multipole device 500 for influencing a charged particle beam propagating along the optical axis A, wherein the substrate 110 includes an at least partially conical aperture opening 502. The beam limiting edge 122 of the aperture opening is arranged at an entrance side of the aperture opening, where the charged particle beam may enter the aperture opening. Each of the four or more electrodes is arranged at a radial distance M from the beam limiting edge of the aperture opening. The radial distance M may be larger than 100 μm and/or may be larger than the minimum radius of the aperture opening.

FIG. 6 shows an electrostatic multipole device 600 for influencing a charged particle beam propagating along the optical axis A. The substrate 110 of the multipole device 600 includes an isolator layer 212 on top of which the electrodes are formed and a further layer 214 made of a conductor or semiconductor material which comprises the beam limiting edge 122 of the aperture opening. The aperture opening extends through the insulator layer with a first larger diameter and through the further layer 214 with a second smaller diameter. On the inner surface of the aperture opening 120, the isolator layer 212 is removed in a radial direction with respect to the further layer, in order to prevent surface charges to accumulate on an exposed insulator surface. In some implementations, the first diameter may be greater than the distance between two opposedly arranged electrodes so that an undercut 602 is provided below the electrodes.

In some embodiments, which may be combined with other embodiments disclosed herein, the aperture opening 120 may be configured as a beam limiting opening. In other words, the diameter of the charged particle beam upstream from the electrostatic multipole device may be larger than the minimum diameter D of the aperture opening 120, so that the beam may be partially blocked by the beam limiting edge 122 of the aperture opening 120 and may centrally enter as a circular beamlet between the electrodes at a radial distance therefrom. Correction accuracy can be increased. A conductor or semiconductor layer (further layer 214) arranged on an upstream side of the insulator layer 212 may prevent surfaces charges of blocked beam portions to accumulate on the second main surface 114 of the electrostatic multipole device.

An electrostatic multipole device according to embodiments described herein with four or more electrodes may be configured for correcting at least one of a beam aberration caused by one or more further electrostatic deflectors, an astigmatism of the charged particle beam, a spherical aberration of the charged particle beam, and a hexapole or a higher order aberration of the charged particle beam.

Figure 7:
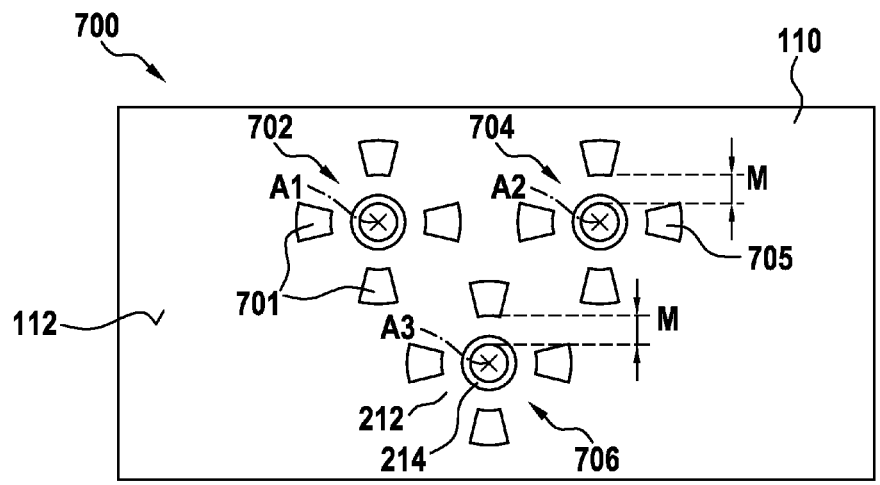
FIG. 7 shows an electrostatic multipole arrangement according to embodiments described herein in a schematic front view.

FIG. 7 shows an electrostatic multipole arrangement 700 according to embodiments described herein in a schematic front view. The electrostatic multipole arrangement 700 is configured to individually influence at least a first beamlet and a second beamlet of charged particles propagating side-by-side along a main propagation direction. The embodiment shown in FIG. 7 is configured to influence a total of three beamlets of charged particles. The beamlets may propagate parallel with respect to each other. In some cases, the beamlets may propagate at an angle with respect to each other, e.g. at an angle smaller than 100 mrad, particularly smaller than 20 mrad. For example, the beamlets may come from a single beam source. In this case, the main propagation direction may correspond to the main emission direction of the beam source.

The multipole arrangement 700, which may also be referred to as a multipole array or as an "array of multipole devices", includes a first multipole device 702, a second multipole device 704, and a third multipole device 706 in accordance with any of the embodiments described herein. The multipole devices 702, 704, 706 may include a single common substrate 110 including several aperture openings extending through the substrate 110. In the embodiment shown in FIG. 7, the substrate 110 includes a total of three aperture openings arranged in a predetermined array or pattern in the substrate 110.

The first electrostatic multipole device 702 may be configured to influence the first beamlet of charged particles propagating along a first optical axis A1, the second electrostatic multipole device 704 may be configured to influence the second beamlet of charged particles propagating along a second optical axis A2, and the third multipole device 706 may be configured to influence the third beamlet of charged particles propagating along a third optical axis A3.

The electrostatic multipole arrangement 700 may include more than three electrostatic multipole devices, e.g. five, ten or more electrostatic multipole devices which may be arranged in a given 1-dimensional or 2-dimensional pattern or array. For example, the multipole arrangement may be provided in the form of a 2-dimensional multipole array. In some embodiments, the electrostatic multipole arrangement 700 may include a single common substrate with a first main surface on top of which numerous electrodes are formed.

The average distance between the centers of two adjacent aperture openings of the array may be less than 5 mm, particularly less than 3 mm, more particularly less than 2 mm.

In some embodiments, a multipole arrangement may include a substrate with two or more aperture openings which extend through the substrate in a predetermined array pattern, e.g. round or circular aperture openings. Each aperture opening may be configured to generating a beamlet of charged particle beams, e.g. a round or circular beamlet, from a wide-angle charged particle beam emitted by a beam source, e.g. an electron source. An upstream surface of the substrate may be a conductive or semiconductor surface so that charged particles hitting said surface do not accumulate on said surface. In some implementations, which may be combined with other implementations described herein, the electrodes are held on the first main surface of the substrate which is an insulator surface.

Four or more first beamlet electrodes 701 are formed on the first main surface 112 of the substrate to influence the first beamlet, wherein each of the four or more first beamlet electrodes 701 is arranged at a radial distance M from a beam limiting edge of the first aperture opening. The four or more first beamlet electrodes may be arranged at respective angular positions around the first aperture opening. Similarly, four or more second beamlet electrodes 705 are formed on the first main surface 112 of the substrate to influence the second beamlet, wherein each of the four or more second beamlet electrodes 705 is arranged at a radial distance M from a beam limiting edge of the second aperture opening. The four or more second beamlet electrodes may be arranged at respective angular positions around the second aperture opening.

The configuration of the substrate 110, of the aperture openings and of the electrodes formed on the first main surface of the substrate may correspond partially or entirely to the configurations explained above with regard to FIGS. 1 to 6 in an arbitrary combination as appropriate so that reference can be made to the above embodiments. In particular, the substrate may have an insulator layer 212 and a further layer 214 comprising a conductor or semiconductor material, wherein the diameter of the aperture openings in the further layer 214 may be smaller than the diameter of the aperture opening in the insulator layer 212.

Figure 8:
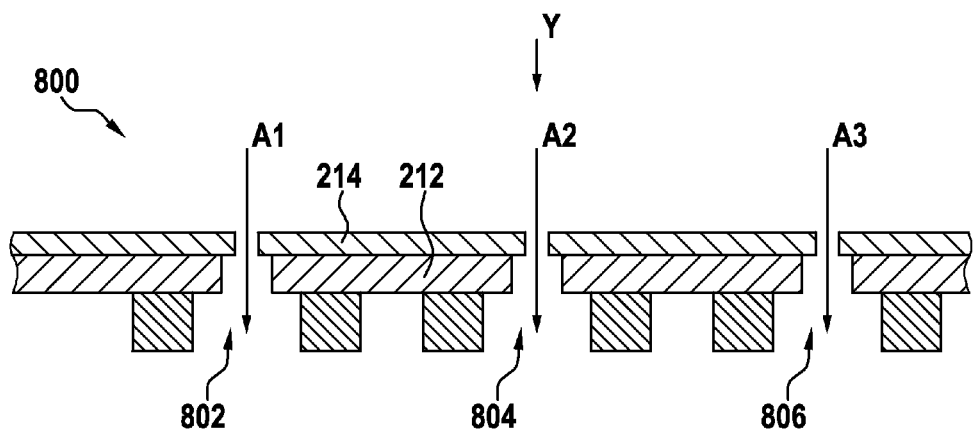
FIG. 8 shows an electrostatic multipole arrangement according to embodiments described herein in a schematic sectional view.

FIG. 8 shows an electrostatic multipole arrangement 800 provided as a linear array of electrostatic multipole devices 802, 804, 806 in a schematic sectional view. The multipole arrangement 800 may be manufactured from a single three-layer wafer with a top layer, an insulator layer and a further layer comprising a conductor or semiconductor material, wherein the insulator layer is sandwiched between the other two layers. Parts of the top layer may be removed, e.g. by etching, so that the remaining parts of the top layer form the electrodes of the various electrostatic multipole devices 802, 804, 806.

As is illustrated in FIG. 8, the distances between two electrodes arranged on opposite sides of an aperture opening is larger than the diameter of the respective aperture opening so that each electrode is arranged at a radial distance from a beam limiting edge of the respective aperture opening. Therefore, the charged particles of the charged particle beam propagating through the respective aperture opening pass at a distance from the electrodes, where a high-quality electric deflection or correction field can be provided.

Figure 9:
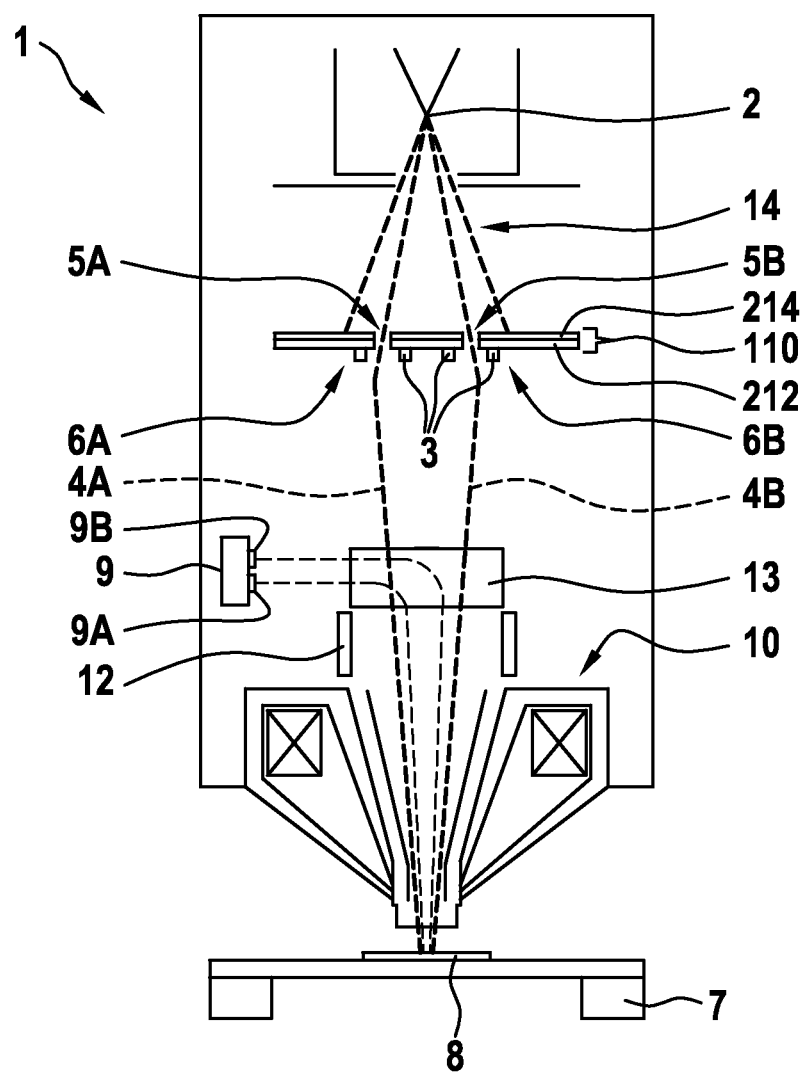
FIG. 9 shows a charged particle beam device with an electrostatic multipole arrangement according to embodiments described herein in a schematic view.

FIG. 9 shows a charged particle beam device 1 with two electrostatic multipole devices 6A and 6B according to embodiments described herein. In other embodiments, only a single multipole device or more than two multipole devices, which can be arranged in a two-dimensional array, may be provided.

In the embodiment shown in FIG. 9, the electrostatic multipole devices 6A, 6B may be configured to influence two beamlets 4A, 4B of charged particles which propagate side-by-side along a main propagation direction M. Influencing a beamlet may include at least one of correcting aberrations of the beamlet and deflecting the beamlet via an electric field provided by electrodes 3 which are arranged on a first main surface of a substrate 110.

A charged particle beam device 1 according to embodiments described herein may include at least one beam source 2 for generating a charged particle beam propagating along an optical axis A and at least one electrostatic multipole device 6A, 6B or electrostatic multipole arrangement according to embodiments described herein.

The beam source 2 may be configured to emit a charged particle beam 14. As described herein, a cold field emitter (CFE), a Schottky emitter, a TFE or another high current e-beam source may be provided, e.g. to increase the throughput. A high current is considered to be 10 μA in 100 mrad or above, for example up to 5 mA, e.g. 30 μA in 100 mrad to 1 mA in 100 mrad. According to typical implementations, the current is distributed essentially uniform, e.g. with a deviation of +−10%, particularly in the case of a linear or rectangular array.

According to some embodiments, which can be combined with other embodiments described herein, the source or virtual source can have a diameter of 2 nm to 40 nm and/or have a typical emission half angle of 5 mrad or above, e.g. 50 mrad to 200 mrad.

According to yet further embodiments, which can be combined with other embodiments described herein, a TFE or another high reduced-brightness source, e.g. an e-beam source, capable of providing a large beam current is a source where the brightness does not fall by more than 20% of the maximum value when the emission angle is increased to provide a maximum of 10 μA-100 μA, for example 30 μA. Schottky or TFE emitters are currently available with a measured reduced-brightness of $5 \cdot 10^7$ $Am^{-2}(SR)^{-1}V^{-1}$, CFE emitters have a measured reduced-brightness of up to $5 \cdot 10^9$ $Am^{-2}$ $(SR)^{-1}V^{-1}$. The system may also work with a carbide emitter such as a HfC which can have a reduced brightness of approximately $1 \cdot 10^{11}$ $Am^{-2}(SR)^{-1}V^{-1}$. For example, a beam which has at least $5 \cdot 10^7$ $Am^{-2}(SR)^{-1}V^{-1}$ is beneficial.

After leaving the charged particle source 2, the generated charged particle beam 14 may pass through the aperture openings 5A, 5B provided in the substrate 110. The aperture openings can be situated along a ring on the substrate or along any other arrangement or array such as a line, rectangle, or square. By passing through the aperture openings 5A, 5B of the substrate, multiple charged particle beams or beamlets 4A, 4B are created. The electrodes 3 of the electrostatic multipole devices 6A, 6B may be formed on a downstream side of the substrate. The electrodes 3 are configured to provide an electric correction or deflection field. By propagating through an electric correction field, beamlet aberrations may be compensated for.

Thereafter, the charged particle beams or beamlets 4A. 4B may pass a beam separator assembly 13, which may be configured to separate the primary beams from secondary beams or backscattered beams, i.e. signal beams.

Thereafter, the beamlets 4A, 4B may pass a scanning deflector 12, which is, for example, used to move the beamlets 4A, 4B in a raster over the surface of a specimen 8. After the scanning deflector 12, the beamlets 4A, 4B enter an objective lens 10 that focuses the beamlets 4A, 4B onto the specimen 8. The objective lens 10 not only focuses the beamlets 4A. 4B, but also rotates the beamlets 4A, 4B. However, this effect is not shown because it is difficult to depict in a two-dimensional drawing and because the skilled person is well aware of this additional effect. Due to the combined effects of the electrostatic multipole devices 6A. 6B and the objective lens 10, multiple spots (images of the particle source 2), each corresponding to one of the beamlets 4A, 4B, are created on the specimen 8.

When the beamlets 4A, 4B strike the surface of the specimen 8, the beamlets undergo a series of complex interactions with the nuclei and electrons of the atoms of the specimen. The interactions produce a variety of secondary products, such as electrons of different energy, X-rays, heat, and light. Many of these secondary products are used to produce the images of the sample and to collect additional data. A secondary product of major importance to examination or the image formation of the specimen are secondary electrons that escape from the specimen 8 at a variety of angles with relatively low energy (1 to 50 eV). The signal electrons are extracted from the specimen through the objective lens 10, are separated from the primary beams in the beam separator assembly 13, and reach a detector assembly 9. The detector assembly 9 may include detector elements 9A, 9B, which are configured for generation of a measurement signal, e.g. an electronic signal corresponding to the detected signal electrons.

By scanning the beamlets 4A, 4B over the specimen 8 and displaying/recording the output of the detector assembly 9 or detector elements 9A, 9B, multiple independent images of the surface of the specimen 8 are generated. Each image contains information about a different portion of the surface of the specimen. Accordingly, the speed of the data acquisition is increased with regard to the conventional single beam case. The specimen 8 may be supported on a stage 7 (specimen support) which is moveable horizontally in all directions, in order to allow the beamlets 4A, 4B to reach the target areas on the specimen which are to be examined. The stage can also move in a first direction while the beams are scanned in a second direction. This will improve throughput further, since no stage settling time is required.

In order to improve the performance of the system, the embodiment shown in FIG. 9 may contain an objective lens 10, which is a combination of a magnetic lens and an electrostatic lens. Accordingly, the objective lens 10 is a compound magnetic-electrostatic lens. The electrostatic part of the compound magnetic-electrostatic lens 10 may be an electrostatic retarding lens. Using such a compound magnetic-electrostatic lens 10 yields superior resolution at low landing energies, such as a few hundred electron volts in the case of a SEM. Such low landing energies are desirable, especially in modern semiconductor industry, to avoid charging and/or damaging of radiation sensitive specimens. However, in some cases, only a magnetic lens or only an electrostatic lens may be used.

According to embodiments described herein, a single-beam column with a single charged particle beam may be provided. According to some embodiments, a multi-beamlet column may be provided with a number of beams, such as two or more, or 5 or more, or 8 or more, according to some examples up to 200. The multi-beamlet column is configured such that the multi-beamlet column can also be arrayed in a multi-column system. Arraying multiple columns then provides an even higher number of beamlets working on the same sample (e.g. a wafer or a mask).

According to embodiments described herein, the primary electron beams and the secondary or signal electron beams are separated; particularly the signal electron detection is conducted off-axis, i.e. off-axis with respect to the optical axis defined by the objective lens. An efficient detection with negligible crosstalk between the different signals and a small or no effect on the primary beam performance can be provided. According to yet further embodiments, which can be combined with other embodiments described herein, the pitch of the primary beams on the sample is large enough that the pitch of the signal-electron-beamlets is sufficient such that the signal electron detection can be performed without or at least with negligible crosstalk. For example, the pitch on the specimen, e.g. a wafer, i.e. a minimal distance between two primary beamlets on the specimen, can be 10 μm or above, for example 40 μm to 100 μm. Accordingly, embodiments provide a multi-beam device which generates a reasonable number of primary electron beamlets within one electron optical column, wherein crosstalk is reduced, and which optionally provides the opportunity to array several of the multi-beam devices, i.e. multiple of the columns. Accordingly, it is further desired to have the option to array multi beamlet columns in a multi-column module (MCM).

According to a further aspect described herein, a method of manufacturing an electrostatic multipole device for influencing a charged particle beam propagating along an optical axis A is described. The electrostatic multipole device may be manufactured as a MEMS-module (micro-electro-mechanical system).

FIG. 10A to FIG. 10E illustrate various actions of a method according to embodiments described herein. The method includes, as is shown by reference sign 1010 in FIG. 10A, providing a multilayer substrate 1011 with an insulator layer 1012 and a conductor or semiconductor layer 1013 arranged on the insulator layer 1012. The substrate may be an SOI-wafer (Silicon-on-Insulator). In some embodiments, the conductor or semiconductor layer 1013 comprises or is made of silicon or doped silicon. The silicon may be of a low resistance or, in other words, may be conductive.

Figure 10A:
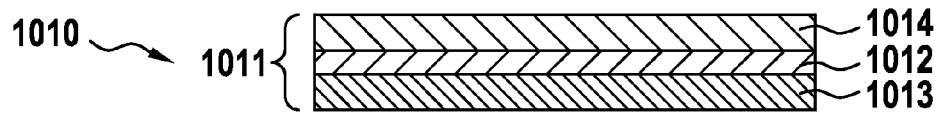
FIG. 10A-10E illustrate various processes of a method of manufacturing an electrostatic multipole device according to embodiments described herein.
Figure 10B:
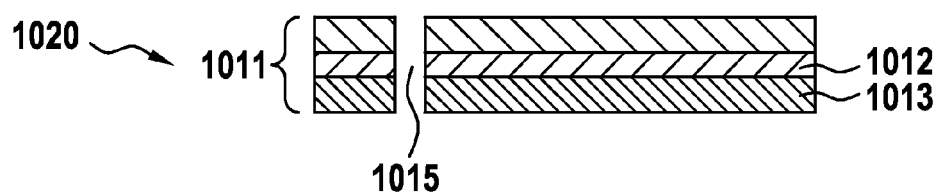

As is illustrated by reference sign 1020 in FIG. 10B, at least one aperture opening 1015 for the charged particle beam which extends along the optical axis A through the multilayer substrate is formed. The aperture opening 1015 may extend in a perpendicular direction with respect to the substrate plane. The aperture opening may be formed by etching the multilayer substrate. In some implementations, two etching steps may be reasonable for etching both the insulator layer 1012 and the conductor or semiconductor layer 1013. A round or circular aperture opening may be etched. In some implementations, an aperture opening with a minimum diameter of less than 500 μm or less than 100 μm may be useful.

As is illustrated by reference sign 1030 in FIG. 10C, the conductor or semiconductor layer 1013 is partially removed such that remaining portions of the conductor or semiconductor layer 1013 form four or more electrodes 1016 on a first main surface 1017 of the insulator layer 1012 to influence the charged particle beam propagating through the aperture opening 1015. In some embodiments, the aperture opening may be formed after having formed the electrodes 1016. However, when forming the electrodes 1016 after having formed the aperture opening 1015, the aperture opening can be used as a reference point arranged at the center of the four or more electrodes to be formed.

Portions of the conductor or semiconductor layer 1013 may be removed by providing a mask on top of the conductor or semiconductor layer 1013 and etching the layer.

The four or more electrodes 1016 may be arranged at a radial distance from a beam limiting edge of the aperture opening. Then, the charged particle beam propagating through the aperture opening passes at a distance from the electrodes 1016. The distance between two oppositely arranged electrodes 1016 may be more than twice or more than five times the minimum diameter of the aperture opening 1015.

In some embodiments, which may be combined with other embodiments disclosed herein, the multilayer substrate 1011 is provided as a three-layer substrate with the insulator layer 1012 being arranged between the conductor or semiconductor layer 1013 and a further conductor or semiconductor layer 1014. Both the conductor or semiconductor layer 1013 and the further conductor or semiconductor layer 1014 may comprise or be made of silicon or doped silicon. The multilayer substrate 1011 may be provided as a three-layer SOI-wafer, with an insulator layer arranged between two silicon layers. The insulator layer may be a SiO2 layer or a sapphire layer, for example.

Figure 10C:
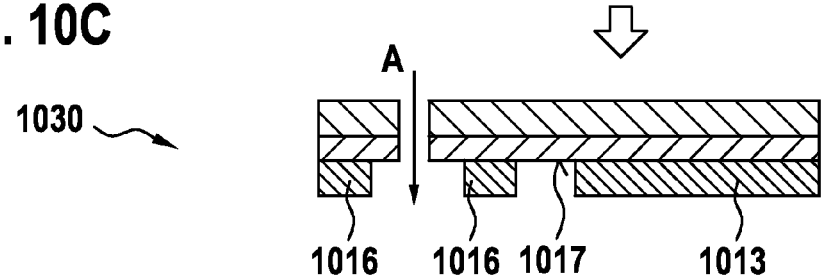
Figure 10D:
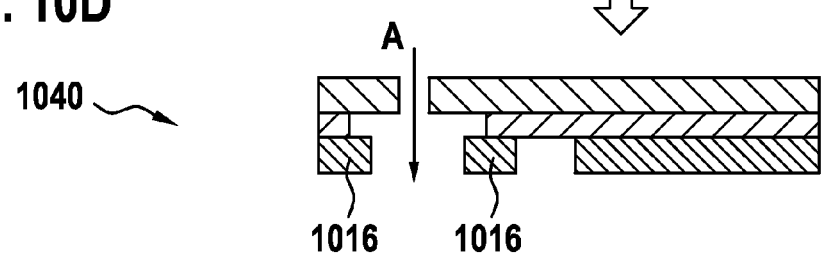
Figure 10E:
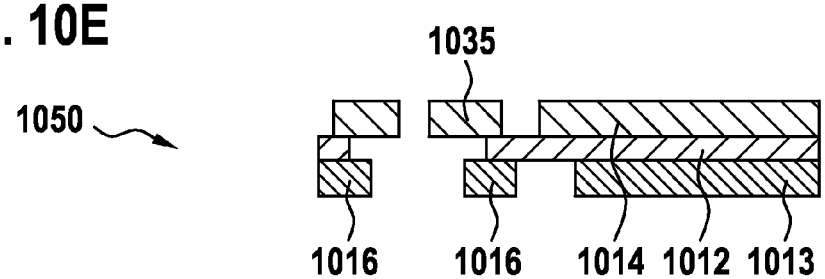

FIG. 10D shows an optional action to be performed after having formed the aperture opening 1015. Namely, the insulator layer 1012 may be partially removed inside the aperture opening in a radial direction, in order to prevent charged particles from contacting exposed surface portions of the insulator layer.

In some embodiments, the aperture opening 1015 may extend through the insulator layer 1012 with a first diameter and through the further conductor or semiconductor layer 1014 with a second diameter which is smaller than the first diameter to form the beam limiting edge of the aperture opening. For example, an undercut may be formed, where the diameter of the insulator layer is larger than the distance between two opposedly arranged electrodes. The insulator layer may be removed by etching, e.g. by undercut etching. It is illustrated by reference sign 1040 in FIG. 10D that etching the isolator layer 1012 may comprise etching away at least part of the insulator layer below the four or more electrodes to produce the undercut.

In some embodiments, which may be combined with other embodiments disclosed herein, the method further comprises at least partially coating the multilayer substrate with a high-resistance layer. Coating may comprise coating of at least one of: an inner surface of the aperture opening, after having formed the aperture opening; the first main surface of the first layer exposed between the four or more electrodes, to allow a current flow between at least two of the four or more electrodes; and an exposed second main surface of the further conductor or semiconductor layer 1014. If no further conductor or semiconductor layer is provided, the exposed upstream side of the insulator layer may be coated. The high-resistance layer may be a carbon layer. Coating a surface between two electrodes with a high-resistance layer may lead to an electrical resistance of several GΩ between two adjacent electrodes. No surface charges can accumulate on top of a high-resistance layer so that the electric field generated by the electrodes 1016 will not be disturbed.

In yet further embodiments which may be combined with other embodiments described herein, also the further conductor or semiconductor layer 1014 is partially removed so that the remaining portion of the further conductor or semiconductor layer 1014 forms at least one further electrode. Reference is made to reference sign 1050 in FIG. 10E which shows a partially etched further conductor or semiconductor layer 1014. For example, an individually addressable lenslet electrode 1035 may be formed from the further conductor or semiconductor layer. The lenslet electrode 1035 may comprise the beam limiting edge of the aperture opening.

After having partially removed one of the layers 1012 and 1014, e.g. by etching, the multilayer substrate may be turned by 180°, in order to be in a position to partially remove the other of layers 1012 and 1014, e.g. in the same etching apparatus.

When partially removing the conductor or semiconductor layer 1013, as shown in FIG. 10C, conducting or semiconducting portions which may constitute connection lines for connecting an electrode with an electric potential may be left back on top of the insulator layer 1012, in addition to the electrodes 1016. For example, connection lines which extend radially outward from each of the electrodes 1016 may be left back on the insulator layer when etching the conductor or semiconductor layer 1013. Thus, no further processing actions are needed for connecting the electrodes with respective contacts configured to be connected to a voltage supply. Therefore, the manufacturing method described herein can be further simplified.

According to some embodiments, which can be combined with other embodiments described herein, one or more beamlets of charged particles are created from a charged particle beam by sending the charged particle beam through the substrate with one or more aperture openings which have a diameter smaller than the diameter of the charged particle beam (beam limiting apertures). Then, each of the beamlets may constitute a charged particle beam or beamlet to be influenced by the electric field provided by the electrodes.

While the foregoing is directed to embodiments of the invention, other and further embodiments of the invention may be devised without departing from the basic scope thereof, and the scope thereof is determined by the claims that follow.

The invention claimed is:

1. An electrostatic multipole device for influencing a charged particle beam propagating along an optical axis, comprising:
   a substrate with at least one aperture opening for the charged particle beam, which extends along the optical axis through the substrate; and
   four or more electrodes which are formed on a first main surface of the substrate for influencing the charged particle beam propagating through the aperture opening, wherein each of the four or more electrodes is arranged at the same distance from the optical axis and at a radial distance from a beam limiting edge of the aperture opening,
   wherein the substrate comprises at least one insulator layer, which comprises the first main surface on which the electrodes are formed.

2. The electrostatic multipole device of claim 1, wherein the aperture opening has a round or circular cross-sectional shape.

3. The electrostatic multipole device of claim 1, wherein a minimum radius of the aperture opening is smaller than a minimum distance between the optical axis and each of the four or more electrodes.

4. The electrostatic multipole of claim 3, wherein a ratio between the minimum radius of the aperture opening and the minimum distance between the optical axis and each of the four or more electrodes is less than ½.

5. The electrostatic multipole device of claim 1, wherein eight, twelve or twenty electrodes are formed on the first main surface of the substrate at evenly spaced angular positions around the optical axis.

6. The electrostatic multipole device of claim 1, wherein the four or more electrodes comprise silicon or doped silicon.

7. The electrostatic multipole device of claim 1, wherein the four or more electrodes are formed by material removal from a semiconductor containing top layer arranged on the insulator layer.

8. The electrostatic multipole device of claim 1, wherein the substrate comprises a further layer which comprises a second main surface of the substrate opposite the first main surface, wherein the further layer is a conductor layer or a semiconductor layer.

9. The electrostatic multipole device of claim 8, wherein the further layer is a silicon containing bottom layer of an SOI-wafer.

10. The electrostatic multipole device of claim 8, wherein the aperture opening extends through the insulator layer with a first diameter and through the at least one further layer with a second diameter which is smaller than the first diameter to form the beam limiting edge of the aperture opening.

11. The electrostatic multipole device of claim 1, further comprising a high-resistance layer which covers at least a part of the first main surface to allow a current flow between at least two of the four or more electrodes.

12. An electrostatic multipole arrangement for individually influencing at least a first beamlet of charged particles propagating along a first optical axis and a second beamlet of charged particles propagating along a second optical axis, comprising:
    a substrate with a first aperture opening for generating the first beamlet which extends through the substrate along the first optical axis and a second aperture opening for generating the second beamlet which extends through the substrate along the second optical axis;
    four or more first beamlet electrodes which are formed on a first main surface of the substrate for influencing the first beamlet, wherein each of the four or more first beamlet electrodes is arranged at the same distance from the first optical axis and at a radial distance from a beam limiting edge of the first aperture opening,
    four or more second beamlet electrodes which are formed on the first main surface of the substrate for influencing the second beamlet, wherein each of the four or more second beamlet electrodes is arranged at the same distance from the second optical axis and at a radial distance from a beam limiting edge of the second aperture opening,
    wherein the substrate comprises at least one insulator layer, which comprises the first main surface on which the electrodes are formed.

13. A method of manufacturing an electrostatic multipole device for influencing a charged particle beam propagating along an optical axis, comprising:
    providing a multilayer substrate with an insulator layer and a conductor or semiconductor layer arranged on top of the insulator layer,
    forming at least one aperture opening for the charged particle beam which extends along the optical axis through the multilayer substrate,
    partially removing the conductor or semiconductor layer such that remaining portions of the conductor or semiconductor layer form four or more electrodes on a first main surface of the insulator layer for influencing the charged particle beam propagating through the aperture opening,
    wherein each of the four or more electrodes is arranged at the same distance from the optical axis and at a radial distance from a beam limiting edge of the aperture opening.

14. The method of claim 13, wherein providing the multilayer substrate comprises:
    providing the multilayer substrate with the insulator layer being arranged between the conductor or semiconductor layer and a further conductor or semiconductor layer.

15. The method of claim 14, further comprising etching away at least part of the insulator layer so that the aperture opening extends through the insulator layer with a first diameter and through the further conductor or semiconductor layer with a second diameter which is smaller than the first diameter to form the beam limiting edge of the aperture opening.

16. The method of claim 15, wherein etching comprising etching away at least part of the insulator layer below the four or more electrodes to produce an undercut.

17. The method of claim 14, wherein the multilayer substrate is provided as an SOI-wafer comprising the insulator layer sandwiched between the conductor or semiconductor layer and the further conductor or semiconductor layer.

18. The method of claim 13, wherein partially removing the conductor or semiconductor layer comprises arranging a mask on the conductor or semiconductor layer and etching the conductor or semiconductor layer to form the four or more electrodes.

19. The method of claim 13, further comprising:
    at least partially coating the multilayer substrate with a high-resistance layer.

* * * * *